US007205084B2

(12) United States Patent
Van Damme et al.

(10) Patent No.: US 7,205,084 B2
(45) **Date of Patent: *Apr. 17, 2007**

(54) HEAT-SENSITIVE LITHOGRAPHIC PRINTING PLATE PRECURSOR

(75) Inventors: Marc Van Damme, Bonheiden (BE); Huub Van Aert, Pulderbos (BE)

(73) Assignee: AGFA-Gevaert, Mortsel (BE)

( * ) Notice: Subject to any disclaimer, the term of this patent is extended or adjusted under 35 U.S.C. 154(b) by 0 days.

This patent is subject to a terminal disclaimer.

(21) Appl. No.: 10/834,555

(22) Filed: Apr. 29, 2004

(65) Prior Publication Data

US 2005/0136356 A1 Jun. 23, 2005

Related U.S. Application Data

(60) Provisional application No. 60/536,185, filed on Jan. 13, 2004.

(30) Foreign Application Priority Data

Dec. 18, 2003 (EP) ............................... 03104784.8

(51) Int. Cl.
*G03F 7/11* (2006.01)
*G03F 7/30* (2006.01)

(52) U.S. Cl. .................. 430/166; 430/190; 430/270.1; 430/302; 430/944

(58) Field of Classification Search ................ 430/166, 430/190, 270.1, 271.1, 302, 944
See application file for complete search history.

(56) References Cited

U.S. PATENT DOCUMENTS

| | | | | |
|---|---|---|---|---|
| 4,939,229 | A | 7/1990 | Bogan, Jr. | |
| 5,340,699 | A | 8/1994 | Haley et al. | |
| 5,372,907 | A | 12/1994 | Haley et al. | |
| 5,372,915 | A | 12/1994 | Haley et al. | |
| 5,641,608 | A | 6/1997 | Grunwald et al. | |
| 6,200,727 | B1 * | 3/2001 | Urano et al. | 430/270.1 |
| 6,248,503 | B1 | 6/2001 | Vermeersch et al. | |
| 6,376,150 | B1 * | 4/2002 | Bolli et al. | 430/165 |
| 6,436,596 | B1 | 8/2002 | Aono et al. | |
| 6,573,022 | B1 * | 6/2003 | Miyake et al. | 430/270.1 |
| 6,858,359 | B2 * | 2/2005 | Kitson et al. | 430/14 |
| 2002/0009671 | A1 | 1/2002 | Gries et al. | |
| 2003/0165774 | A1 | 9/2003 | Arias et al. | |
| 2004/0018444 | A1 | 1/2004 | Nakamura et al. | |
| 2005/0037280 | A1 * | 2/2005 | Loccufier et al. | 430/270.1 |

FOREIGN PATENT DOCUMENTS

| | | | |
|---|---|---|---|
| EP | 0 625 728 | A2 | 11/1994 |
| EP | 0 864 420 | A1 | 9/1998 |
| EP | 0 914 941 | A1 | 5/1999 |
| EP | 0 934 822 | A1 | 8/1999 |
| EP | 0 982 123 | A2 | 3/2000 |
| EP | 1 072 432 | A2 | 1/2001 |
| EP | 1 366 926 | A1 | 12/2003 |
| WO | WO 97/39894 | A1 | 10/1997 |
| WO | WO 99/01795 | A2 | 1/1999 |
| WO | WO 2004/035310 | A1 | 4/2004 |
| WO | WO 2004/035645 | A1 | 4/2004 |
| WO | WO 2004/035686 | A2 | 4/2004 |
| WO | WO 2004/035687 | A1 | 4/2004 |

OTHER PUBLICATIONS

EPO Communication in EP 03 10 4784 (Apr. 20, 2004).

* cited by examiner

*Primary Examiner*—John S. Chu
(74) *Attorney, Agent, or Firm*—Leydig, Voit & Mayer, Ltd.

(57) ABSTRACT

A heat-sensitive lithographic printing plate precursor is disclosed which comprises a hydrophilic support and an oleophilic coating thereon which comprises an infrared light-to-heat converter, an alkali-soluble binder and a polymeric developer accelerator. The polymeric developer accelerator is preferably a phenolic formaldehyde resin comprising at least 70 mol % of meta-cresol as recurring unit or at least 40 mol % of monohydroxy benzene cresol as recurring unit. The PDA may also be a phenolic resin which comprises at least 5 mol % of a recurring monomeric unit having at least one phenolic hydroxyl group and at least one alkali solubilising group. The polymeric developer accelerator improves the sensitivity while maintaining a good underexposure latitude and a good developer resistance of the printing plate.

34 Claims, 2 Drawing Sheets

HEAT-SENSITIVE LITHOGRAPHIC PRINTING PLATE PRECURSOR

CROSS-REFERENCE TO RELATED PATENT APPLICATIONS

This application claims the benefit of U.S. Provisional Application No. 60/536,185 filed Jan. 13, 2004, which is incorporated by reference. In addition, this application claims the benefit of European Application No. 03104784.8 filed Dec. 18, 2003, which is also incorporated by reference.

FIELD OF THE INVENTION

The present invention relates to a positive-working heat-sensitive lithographic printing plate precursor.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called “wet” lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

A typical printing plate precursor for computer-to-film methods comprise a hydrophilic support and an image-recording layer of a photosensitive polymer which include UV-sensitive diazo compounds, dichromate-sensitized hydrophilic colloids and a large variety of synthetic photopolymers. Particularly diazo-sensitized systems are widely used. Upon image-wise exposure, typically by means of a film mask in a UV contact frame, the exposed image areas become insoluble and the unexposed areas remain soluble in an aqueous alkaline developer. The plate is then processed with the developer to remove the diazonium salt or diazo resin in the unexposed areas. So the exposed areas define the image areas (printing areas) of the printing master, and such printing plate precursors are therefore called ‘negative-working’. Also positive-working materials, wherein the exposed areas define the non-printing areas, are known, e.g. plates having a novolac/naphtoquinone-diazide coating which dissolves in the developer only at exposed areas.

In addition to the above photosensitive materials, also heat-sensitive printing plate precursors have become very popular. Such thermal materials offer the advantage of daylight-stability and are especially used in the so-called computer-to-plate method wherein the plate precursor is directly exposed, i.e. without the use of a film mask. The material is exposed to heat or to infrared light and the generated heat triggers a (physico-)chemical process, such as ablation, polymerization, insolubilisation by cross-linking of a polymer, heat-induced solubilisation, decomposition, or particle coagulation of a thermoplastic polymer latex.

The known heat-sensitive printing plate precursors typically comprise a hydrophilic support and a coating containing an oleophilic polymer, which is alkali-soluble in exposed areas (positive working material) or in the non-exposed areas (negative working material) and an IR-absorbing compound. Such an oleophilic polymer is typically a phenolic resin.

WO 97/39894 describes a positive-working heat-sensitive printing plate precursor which is sensitive to IR light but not to UV light comprising a support and an IR-sensitive coating comprising an oleophilic polymer that is soluble in an aqueous alkaline developer and a dissolution inhibitor which reduces the solubility of the polymer in the developer.

EP-A 0 864 420 describes a positive-working heat-sensitive printing plate precursor comprising a support, a first layer containing an oleophilic polymer that is soluble in an aqueous alkaline developer and an IR-sensitive top layer of which the penetrability by or solubility in the aqueous alkaline developer is changed upon exposure to IR light.

EP-A 0 934 822 describes a photosensitive composition for a lithographic printing plate wherein the composition contains an alkali-soluble resin having phenolic hydroxyl groups and of which at least some of the phenolic hydroxyl groups are esterified by a sulphonic acid or a carboxylic acid compound.

EP-A 1 072 432 describes an image forming material which comprises a recording layer which is formed of a composition whose solubility in water or in an alkali aqueous solution is altered by the effects of light or heat. This recording layer comprises a polymer of vinyl phenol or a phenolic polymer, wherein hydroxy groups and alkoxy groups are directly linked to the aromatic hydrocarbon ring. The alkoxy group is composed of 20 or less carbon atoms.

U.S. Pat. No. 5,641,608 describes a direct process for producing an imaged pattern on a substrate surface for printed circuit board application. The process utilises a thermo-resist composition which undergo a thermally-induced chemical transformation effective either to ablate the composition or to increase or decrease its solubility in a particular developer. The thermo-resist composition comprises phenolic polymers in which free hydroxyl groups are protected. Upon heating in the presence of an acid these protecting groups split off resulting in a solubility change of the composition. In positive thermo-resists the hydroxyl protecting groups may be ethers, such as alkyl-, benzyl-, cycloalkyl- or trialkylsilyl-ethers, and oxy-carbonyl groups.

EP-A 0 982 123 describes a photosensitive resin composition or recording material wherein the binder is a phenolic polymer, substituted with a specific functional group on the aromatic hydrocarbon ring such as a halogen atom, an alkyl group having 12 or less carbon atoms, an alkoxy group, an alkylthio group, a cyano group, a nitro group or a trifluoromethyl group, or wherein the hydrogen atom of the hydroxy group of the phenolic polymer is substituted with a specific functional group such as an amide, a thioamide or a sulphonamide group. As a result, the coating of the recording material has such a high density that improves the intra-film transistivity of heat obtained by the light-to-heat conversion at the time of laser exposure. The high density of the coating makes the image recording material less susceptible to external influences such as humidity and temperature. Consequently, the storage stability of the image recording material can also be enhanced.

U.S. Pat. No. 4,939,229 describes a method for the preparation of branched novolacs, useful for photoresist compositions, by reacting a tris- or tetrakis(dialkylaminoalkyl)phenol with a phenolic compound in the presence of an acid catalyst. Due to the reaction with these intermediate dialkylaminoalkyl-phenol compounds, a reproducible method for the synthesis of branched novolacs is obtained.

WO99/01795 describes a method for preparing a positive working resist pattern on a substrate wherein the coating composition comprises a polymeric substance having functional groups such that the functionalised polymeric substance has the property that it is developer insoluble prior to delivery of radiation and developer soluble thereafter. Suitable functional groups are known to favor hydrogen bonding and may comprise amino, amido, chloro, fluoro, carbonyl, sulphinyl and sulphonyl groups and these groups are bonded to the polymeric substance by an esterification reaction with the phenolic hydroxy group to form a resin ester.

EP-A 02 102 446, filed on 15 Oct. 2002, EP-A 02 102 444, filed on 15 Oct. 2002, EP-A 02 102 445, filed on 15 Oct. 2002, EP-A 02 102 443, filed on 15 Oct. 2002 and EP-A 03 102 522, filed on 13 Aug. 2003, describe positive-working heat-sensitive lithographic printing plate precursors wherein the coating comprises phenolic resins which are modified by various substituents that improve the chemical resistance of the coating, i.e. which render the coating less vulnerable to attack by the organic chemicals that are typically present in fountain solutions, plate cleaners, blanket wash liquids, etc. Such substitution however typically produces a reduction of the sensitivity of the plate because also the resistance of the coating towards the developer is increased: in positive-working lithographic printing plate precursors the exposure energy required for rendering the exposed areas of the coating soluble in the developer determines the sensitivity of the precursor. In order to compensate for this sensitivity decrease by said substitution, it is known to add development accelerators such as cyclic acid anhydrides, phenols or organic acids. These low molecular weight compounds increase the rate of dissolution of the exposed areas, but this measure on its turn also reduces the developer resistance of the unexposed areas. A high developer resistance of the unexposed areas is advantageous because it results in a high developer dissolution contrast, also called development latitude: advantageously, the exposed areas of the coating are completely dissolved in the developer before the non-exposed areas are affected by the developer.

In summary, it remains a problem to provide a thermal positive-working lithographic printing plate precursor with both a high sensitivity and a high developer dissolution contrast.

SUMMARY OF THE INVENTION

The positive-working heat-sensitive lithographic printing plate of the present invention comprises a hydrophilic support and an oleophilic coating provided thereon, said coating comprising an infrared light-to-heat converter, a binder which is soluble in an aqueous alkaline developer and a polymeric development accelerator.

The polymeric development accelerator is a polymer that improves the dissolution contrast during processing between exposed and non-exposed areas, without substantially affecting the developer resistance of the non-exposed areas, i.e. resulting in an improved sensitivity. "Without substantially affecting the developer resistance" means that the addition of the polymeric development accelerator changes the value of the Developer Resistance, as defined in the Examples section below, by at most 7%, more preferably at most 5%, most preferably at most 2%. In accordance with preferred embodiments of the present invention, the sensitivity is improved while maintaining the Under-Exposure Latitude UEL, as defined in the Examples section below, at a high value of at least 20%, more preferably at least 30%, even more preferably at least 40% and most preferably at least 50%.

In a preferred embodiment, the alkali-soluble binder is a chemically modified phenolic resin that provides an improved chemical resistance. In that embodiment, the addition of the polymeric development accelerator surprisingly is capable of improving the sensitivity, i.e. decreasing the developer resistance of the exposed areas, while preserving the developer resistance of the unexposed areas at a high level.

Other specific embodiments of the invention are defined in the dependent claims.

DETAILED DESCRIPTION OF THE INVENTION

Figure 1:
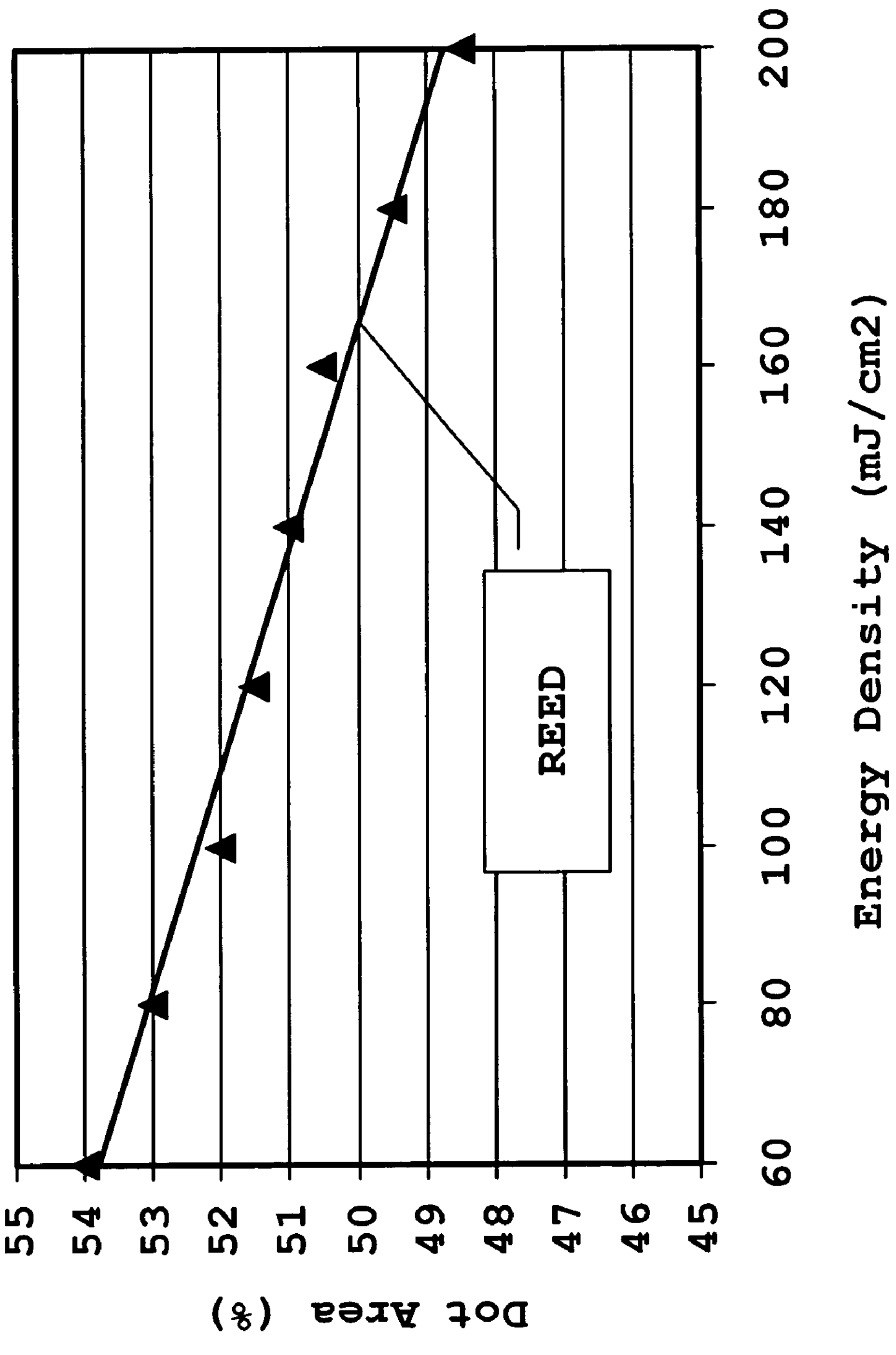
FIG. 1 shows the relationship between the dot area on the plate of Invention Example 1, exposed with a 50% halftone screen @200 lpi (about 80 lines/cm) and the energy density of the exposure.

The lithographic printing plate precursor of the present invention comprises a hydrophilic support and an oleophilic coating provided thereon; the coating comprises an infrared light-to-heat converter such as an infrared dye or pigment, an alkali-soluble binder and a polymeric development accelerator, hereafter also referred to as "PDA".

The PDA used in the plate precursor of the present invention is preferably a phenolic novolac which comprises at least one of the following recurring phenolic monomeric units meta-cresol or monohydroxy benzene, also called phenol, and wherein the phenolic monomeric units are condensed with formaldehyde or aceton, preferably with formaldehyde. The amount of meta-cresol in the phenolic formaldehyde resin is preferably at least 70 mol %, more preferably at least 90 mol %, and most preferably essentially 100 mol %. The amount of phenol in the phenolic formaldehyde resin is preferably at least 40 mol %, more preferably at least 55 mol %, and most preferably at least 70 mol %.

In another embodiment of the present invention, the PDA is preferably a phenolic resin which comprises at least 5 mol % of a recurring monomeric unit having at least one phenolic hydroxyl group and at least one alkali solubilising group, more preferably at least 10 mol % of this recurring monomeric unit, most preferably at least 20 mol % of this recurring monomeric unit. An alkali solubilising group is a group which increases the solubility of the PDA in an aqueous alkaline solution; the alkaline solution has preferably a pH of at least 10. The alkali solubilising group is preferably selected from a hydroxyl group, a carboxylic acid group, a sulphonic acid group, a sulphuric acid group, a phosphonic acid group, a phosphoric acid group or a thiol group; a phenolic hydroxyl group is more preferred. In a still more preferred embodiment, the recurring monomeric unit having at least one phenolic hydroxyl group and at least one alkali solubilising groups has at least two phenolic hydroxyl groups and such a recurring monomeric unit is preferably selected from resorcinol, pyrocatechol, hydroquinone, hydroxy hydroquinone, pyrogallol, phloroglucinol or dihydroxy benzoic acid; resorcinol is more preferred. The recurring monomeric unit having at least one phenolic hydroxyl group and at least one alkali solubilising groups is preferably condensed with formaldehyde or aceton, more preferably with formaldehyde.

The average molecular weight $M_n$ of the polymeric development accelerator is preferably in the range of 300 to 50000 or for $M_w$ in the range of 400 to 100000, more preferably in the range of 500 to 5000 for $M_n$ or in the range of 800 to 20000 for $M_w$, most preferably in the range of 500 to 2500 for $M_n$ or in the range of 800 to 12000 for $M_w$.

Examples of polymers which can be used as a polymer development accelerator are listed below. The average molecular weight $M_n$ or $M_w$ (in g/mol) as indicated in this list, is given by the supplier or is determined by means of Size Exclusion Chromatography, using as eluent tetrahydrofuran or a solution of 0.21 w/w % LiCl in dimethyl acetamide and using polystyrene as calibration standard.

PDA-01: DURITE SD126A is a meta-cresol novolac resin obtained from BORDEN CHEM. INC. ($M_n/M_w$ is 700/1700)

PDA-02: DURITE PD427A is a meta-cresol/para-cresol (75/25 mol %) novolac resin obtained from BORDEN CHEM. INC. ($M_n/M_w$ is 700/2500)

PDA-03: DURITE PD390 is a meta-cresol novolac resin obtained from BORDEN CHEM. INC. ($M_n/M_w$ is 1000/10000)

PDA-04: DURITE PL1626 is a meta-cresol novolac resin obtained from BORDEN CHEM. INC.

PDA-05: ALNOVOL SPN560 a meta-cresol novolac resin obtained from CLARIANT GmbH.

PDA-06: ALNOVOL SPN564 a meta-cresol novolac resin obtained from CLARIANT GmbH.

PDA-07: ALNOVOL HPN564 a fractionated meta-cresol novolac resin obtained from CLARIANT GmbH.

PDA-08: HRJ 2606 is a meta-cresol novolac resin obtained from SCHNECTADY INTERNATIONAL INC.

PDA-09: AV LITE RESIN SP1006N is a phenol formaldehyde novolac resin obtained from SIEBER HEGNER. ($M_n/M_w$ is 1010/6576)

PDA-10: AV LITE RESIN PAPS-PN1 is a phenol formaldehyde novolac resin obtained from SIEBER HEGNER. ($M_n/M_w$ is 340/412)

PDA-11: AV LITE RESIN PAPS-PN2 is a phenol formaldehyde novolac resin obtained from SIEBER HEGNER. ($M_n/M_w$ is 615/720)

PDA-12: AV LITE RESIN PAPS-PN3 is a phenol formaldehyde novolac resin obtained from SIEBER HEGNER. ($M_n/M_w$ is 688/1035)

The amount of the PDA in the coating may depend on the dissolution kinetic of the alkali-soluble binder because binders, which have a lower dissolution rate, preferably need a higher amount of the PDA. Typically the ratio of the amount of the PDA to the amount of the alkali-soluble binder varies from 0.01 to 1 (parts in weight), more preferably 0.05 to 0.8 (parts in weight), most preferably from 0.1 to 0.5 (parts in weight).

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press. A preferred support is a metal support such as aluminum or stainless steel. The metal can also be laminated to a plastic layer, e.g. polyester film.

A particularly preferred lithographic support is an electrochemically grained and anodized aluminum support. Graining and anodization of aluminum is well known in the art. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde It is further evident that one or more of these post treatments may be carried out alone or in combination. More detailed descriptions of these treatments are given in GB-A 1 084 070, DE-A 4 423 140, DE-A 4 417 907, EP-A 659 909, EP-A 537 633, DE-A 4 001 466, EP-A 292 801, EP-A 291 760 and U.S. Pat. No. 4,458,005.

The coating, which is provided on the support, may consist of one or more layer(s). Examples of additional layers besides the layer(s) which comprise the alkali-soluble binder or the layer(s) which comprise the infrared light-to-heat converter are e.g. a "subbing" layer which improves the adhesion of the coating to the support and a covering layer which protects the coating against contamination or mechanical damage.

The alkali-soluble binder can be present in one or more layer(s) of the coating. The amount of the binder is advantageously from 40 to 99.8% by weight, preferably from 70 to 99.4% by weight, particularly preferably from 80 to 99% by weight, based in each case on the total weight of the non-volatile components of the coating. The alkali-soluble binder is preferably an organic polymer which has acidic groups with a pKa of less than 13 to ensure that the layer is soluble or at least swellable in aqueous alkaline developers. Advantageously, the binder is a polymer or polycondensate, for example a polyester, polyamide, polyurethane or polyurea. Polycondensates and polymers having free phenolic hydroxyl groups, as obtained, for example, by reacting phenol, resorcinol, a cresol, a xylenol or a trimethylphenol with aldehydes, especially formaldehyde, or ketones are also particularly suitable. Condensates of sulfamoyl- or carbamoyl-substituted aromatics and aldehydes or ketones are also suitable. Polymers of bismethylol-substituted ureas, vinyl ethers, vinyl alcohols, vinyl acetals or vinylamides and polymers of phenylacrylates and copolymers of hydroxylphenylmaleimides are likewise suitable. Furthermore, polymers having units of vinylaromatics, N-aryl(meth)acrylamides or aryl (meth)acrylates may be mentioned, it being possible for each of these units also to have one or more carboxyl groups, phenolic hydroxyl groups, sulfamoyl groups or carbamoyl groups. Specific examples include polymers having units of 2-hydroxyphenyl (meth)acrylate, of N-(4-hydroxyphenyl)(meth)acrylamide, of N-(4-sulfamoylphenyl)-(meth)acrylamide, of N-(4-hydroxy-3,5-dimethylbenzyl)-(meth)acrylamide, or 4-hydroxystyrene or of hydroxyphenylmaleimide. The polymers may additionally contain units of other monomers which have no acidic units. Such units include vinylaromatics, methyl (meth)acrylate, phenyl(meth)acrylate, benzyl (meth)acrylate, methacrylamide or acrylonitrile.

In a preferred embodiment, the polycondensate is a phenolic resin, such as a novolac, a resole or a polyvinylphenol. The novolac is preferably a cresol/formaldehyde or a cresol/xylenol/formaldehyde novolac, the amount of novolac advantageously being at least 50% by weight, preferably at least 80% by weight, based in each case on the total weight of all binders.

In a preferred embodiment of the present invention, the alkali-soluble binder is a phenolic resin wherein the phenyl group or the hydroxy group of the phenolic monomeric unit are chemically modified with an organic substituent. The phenolic resins which are chemically modified with an organic substituent may exhibit an increased chemical resistance against printing chemicals such as fountain solutions or press chemicals such as plate cleaners. Specially for those modified polymers, the addition of a PDA exhibits an improved sensitivity without substantially affecting the developer resistance. Examples of preferred chemically modified phenolic resins are described in EP-A 0 934 822, EP-A 0 996 869, EP-A 1 072 432, U.S. Pat. No. 5,641,608, EP-A 0 982 123, WO99/01795, EP-A 933682, EP-A 894622 and WO 99/63407 and in unpublished European patent application nos. 02 102 446, 02 102 444, 02 102 445, 02 102 443, all filed on 15 Oct. 2002 and no. 03 102 522, filed on 13 Aug. 2003.

A specific example of a chemically modified phenolic resin comprises a monomeric unit where in the phenyl group is substituted with a group having the structure —N═N—Q, wherein the —N═N— group is covalently bound to a carbon atom of the phenyl group and wherein Q is an aromatic group, most preferably wherein Q is the following formula I:

(formula I)

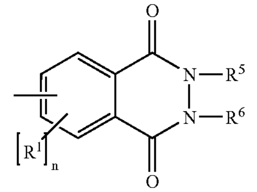

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(═O)(—O—R^2)(—O—R^3)$, $—NR^2—R^3$, $—O—R^2$, $—S—R^2$, —CN, $—NO^2$, a halogen, —N-phthalimidyl, —M—N-phthalimidyl, or $—M—R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

The dissolution behavior of the coating in the developer can be fine-tuned by optional solubility regulating components. More particularly, the coating may also contain developer resistance means, also called development inhibitors, i.e. one or more ingredients which are capable of delaying the dissolution of the unexposed areas during processing. The dissolution inhibiting effect is preferably reversed by heating, so that the dissolution of the exposed areas is not substantially delayed and a large dissolution differential between exposed and unexposed areas can thereby be obtained. Such developer resistance means can be added to a layer comprising the alkali-soluble binder or to another layer of the coating.

The compounds described in e.g. EP-A 823 327 and WO97/39894 are believed to act as dissolution inhibitors due to interaction, e.g. by hydrogen bridge formation, with the alkali-soluble binder(s) in the coating. Inhibitors of this type typically comprise at least one hydrogen bridge forming group such as nitrogen atoms, onium groups, carbonyl (—CO—), sulfinyl (—SO—) or sulfonyl ($—SO_2—$) groups and a large hydrophobic moiety such as one or more aromatic nuclei.

Other suitable inhibitors improve the developer resistance because they delay the penetration of the aqueous alkaline developer into the coating. Such compounds can be present in the layer(s) comprising the alkali-soluble binder, as described in e.g. EP-A 950 518, and/or in a development barrier layer on top of said layer, as described in e.g. EP-A 864 420, EP-A 950 517, WO 99/21725 and WO 01/45958. In the latter embodiment, the solubility of the barrier layer in the developer or the penetrability of the barrier layer by the developer can be increased by exposure to heat or infrared light.

Preferred examples of inhibitors which delay the penetration of the aqueous alkaline developer into the coating include the following:

(a) A polymeric material which is insoluble in or impenetrable by the developer, e.g. a hydrophobic or water-repellent polymer or copolymer such as acrylic polymers, polystyrene, styrene-acrylic copolymers, polyesters, polyamides, polyureas, polyurethanes, nitrocellulosics and epoxy resins; or polymers comprising siloxane (silicones) and/or perfluoroalkyl units.

(b) Bifunctional compounds such as surfactants comprising a polar group and a hydrophobic group such as a long chain hydrocarbon group, a poly- or oligosiloxane and/or a perfluorinated hydrocarbon group. A typical example is Megafac F-177, a perfluorinated surfactant available from Dainippon Ink & Chemicals, Inc. A suitable amount of such compounds is between 10 and 100 mg/$m^2$, more preferably between 50 and 90 mg/$m^2$.

(c) Bifunctional block-copolymers comprising a polar block such as a poly- or oligo(alkylene oxide) and a hydrophobic block such as a long chain hydrocarbon group, a poly- or oligosiloxane and/or a perfluorinated hydrocarbon group. A suitable amount of such compounds is between 0.5 and 25 mg/$m^2$, preferably between 0.5 and 15 mg/$m^2$ and most preferably between 0.5 and 10 mg/$m^2$. A suitable copolymer comprises about 15 to 25 siloxane units and 50 to 70 alkyleneoxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 is or Silikophen P50/X, all commercially available from Tego Chemie, Essen, Germany. Said poly- or oligosiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the polymer or oligomer is at least 2, preferably at least 10, more preferably at least 20. It may be less than 100, preferably less than 60.

It is believed that during coating and drying, the above mentioned inhibitor of type (b) and (c) tends to position itself, due to its bifunctional structure, at the interface between the coating and air and thereby forms a separate top layer even when applied as an ingredient of the coating solution of the layer comprising the alkali-soluble binder. Simultaneously, the surfactants also act as a spreading agent which improves the coating quality. The separate top layer thus formed seems to be capable of acting as the above mentioned barrier layer which delays the penetration of the developer into the coating.

Alternatively, the inhibitor of type (a) to (c) can be applied in a separate solution, coated on top of the layer(s) comprising the alkali-soluble binder. In that embodiment, it may be advantageous to use a solvent in the second coating solution that is not capable of dissolving the ingredients present in the first layer so that a highly concentrated water-repellent or hydrophobic phase is obtained at the top of the coating which is capable of acting as the above mentioned development barrier layer.

The infrared light absorbing dye or pigment may be present in the same layer(s) as the alkali-soluble binder, in the optional barrier layer discussed above and/or in an optional other layer. According to a highly preferred embodiment, the IR absorber is concentrated in or near the barrier layer, e.g. in an intermediate layer between the alkali-soluble binder and the barrier layer. According to that embodiment, said intermediate layer comprises the IR absorbing compound in an amount higher than the amount of IR absorbing compound in the alkali-soluble binder or in the barrier layer. Preferred IR absorbing dyes are cyanine dyes, merocyanine dyes, indoaniline dyes, oxonol dyes, pyrilium dyes and squarilium dyes. Examples of suitable IR dyes are described in e.g. EP-As 823327, 978376, 1029667, 1053868, 1093934; WO 97/39894 and 00/29214. A preferred compound is the following cyanine dye:

IR-1

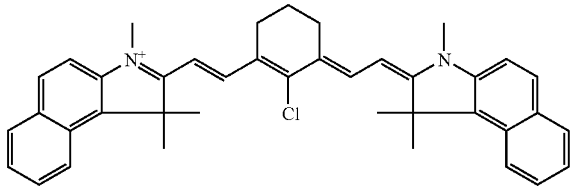

-continued

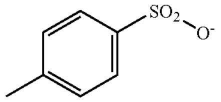

The preferred amount of this dye is less than 40 mg/m$^2$.

To protect the surface of the coating, in particular from mechanical damage, a protective layer may also optionally be applied. The protective layer generally comprises at least one water-soluble binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts, i.e. less than 5% by weight, based on the total weight of the coating solvents for the protective layer, of organic solvents. The thickness of the protective layer can suitably be any amount, advantageously up to 5.0 μm, preferably from 0.1 to 3.0 μm, particularly preferably from 0.15 to 1.0 μm.

Optionally, the coating and more specifically the layer(s) comprising the alkali-soluble binder may further contain additional ingredients.

Colorants can be added such as dyes or pigments which provide a visible color to the coating and which remain in the coating at unexposed areas so that a visible image is produced after exposure and processing. Typical examples of such contrast dyes are the amino-substituted tri- or diarylmethane dyes, e.g. crystal violet, methyl violet, victoria pure blue, flexoblau 630, basonylblau 640, auramine and malachite green. Also the dyes which are discussed in depth in the detailed description of EP-A 400 706 are suitable contrast dyes.

Surfactants, especially perfluoro surfactants, silicon or titanium dioxide particles, polymers particles such as matting agents and spacers are also well-known components of lithographic coatings.

For the preparation of the lithographic plate precursor, any known method can be used. For example, the above ingredients can be dissolved in a solvent mixture which does not react irreversibly with the ingredients and which is preferably tailored to the intended coating method, the layer thickness, the composition of the layer and the drying conditions. Suitable solvents include ketones, such as methyl ethyl ketone (butanone), as well as chlorinated hydrocarbons, such as trichloroethylene or 1,1,1-trichloroethane, alcohols, such as methanol, ethanol or propanol, ethers, such as tetrahydrofuran, glycol-monoalkyl ethers, such as ethylene glycol monoalkyl ether, e.g. 2-methoxy-1-propanol, or propylene glycol monoalkyl ether and esters, such as butyl acetate or propylene glycol monoalkyl ether acetate. It is also possible to use a mixture which, for special purposes, may additionally contain solvents such as acetonitrile, dioxane, dimethylacetamide, dimethylsulfoxide or water.

Any coating method can be used for applying one or more coating solutions to the hydrophilic surface of the support. A multi-layer coating can be applied by coating/drying each layer consecutively or by the simultaneous coating of several coating solutions at once. In the drying step, the volatile solvents are removed from the coating until the coating is self-supporting and dry to the touch. However it is not necessary (and may not even be possible) to remove all the solvent in the drying step. Indeed the residual solvent content may be regarded as an additional composition variable by means of which the composition may be optimised. Drying is typically carried out by blowing hot air onto the coating, typically at a temperature of at least 70° C., suitably 80–150° C. and especially 90–140° C. Also infrared lamps can be used. The drying time may typically be 15–600 seconds.

Between coating and drying, or after the drying step, a heat treatment and subsequent cooling may provide additional benefits, as described in WO99/21715, EP-A 1 074 386, EP-A 1 074 889, WO00/29214, and unpublished Eur. patent application nos. 02 102 413, 02 102 414, 02 102 415, filed on 04 Oct. 2002.

The plate precursor can be image-wise exposed directly with heat, e.g. by means of a thermal head, or indirectly by infrared light, preferably near infrared light. The infrared light is preferably converted into heat by an IR light absorbing compound as discussed above. The heat-sensitive lithographic printing plate precursor is preferably not sensitive to visible light, i.e. no substantial effect on the dissolution rate of the coating in the developer is induced by exposure to visible light. Most preferably, the coating is not sensitive to ambient daylight, i.e. visible (400–750 nm) and near UV light (300–400 nm) at an intensity and exposure time corresponding to normal working conditions so that the plate precursor can be handled without the need for a safe light environment. "Not sensitive" to daylight shall mean that no substantial change of the dissolution rate of the coating in the developer is induced by exposure to ambient daylight. In a preferred daylight stable embodiment, the coating does not comprise photosensitive ingredients, such as (quinone)diazide or diazo(nium) compounds, photoacids, photoinitiators, sensitizers etc., which absorb the near UV and/or visible light that is present in sun light or office lighting and thereby change the solubility of the coating in exposed areas.

The printing plate precursor can be exposed to infrared light by means of e.g. LEDs or a laser. Most preferably, the light used for the exposure is a laser emitting near infrared light having a wavelength in the range from about 750 to about 1500 nm, more preferably 750 to 1100 nm, such as a semiconductor laser diode, a Nd:YAG or a Nd:YLF laser. The required laser power depends on the sensitivity of the plate precursor, the pixel dwell time of the laser beam, which is determined by the spot diameter (typical value of modern plate-setters at $1/e^2$ of maximum intensity: 5–25 μm), the scan speed and the resolution of the exposure apparatus (i.e. the number of addressable pixels per unit of linear distance, often expressed in dots per inch or dpi; typical value: 1000–4000 dpi).

Two types of laser-exposure apparatuses are commonly used: internal (ITD) and external drum (XTD) platesetters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec. An XTD platesetter equipped with one or more laserdiodes emitting in the wavelength range between 750 and 850 nm is an especially preferred embodiment for the method of the present invention.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

The formation of the lithographic image by the plate precursor is due to a heat-induced solubility differential of the coating during processing in the developer. The solubility differentiation between image (printing, oleophilic) and non-image (non-printing, hydrophilic) areas of the lithographic image is believed to be a kinetic rather than a thermodynamic effect, i.e. the non-image areas are characterized by a faster dissolution in the developer than the image-areas. As a result of said dissolution, the underlying hydrophilic surface of the support is revealed at the non-image areas. In a most preferred embodiment, the non-image areas of the coating dissolve completely in the developer before the image areas are attacked so that the latter are characterized by sharp edges and high ink-acceptance. The time difference between completion of the dissolution of the non-image areas and the onset of the dissolution of the image areas is preferably longer than 10 seconds, more preferably longer than 20 seconds and most preferably longer than 60 seconds, thereby offering a wide development latitude.

In the processing step, the non-image areas of the coating are removed by immersion in a conventional aqueous alkaline developer, which may be combined with mechanical rubbing, e.g. by a rotating brush. During development, any water-soluble protective layer present is also removed. Silicate-based developers which have a ratio of silicon dioxide to alkali metal oxide of at least 1 are preferred to ensure that the alumina layer (if present) of the substrate is not damaged. Preferred alkali metal oxides include $Na_2O$ and $K_2O$, and mixtures thereof. In addition to alkali metal silicates, the developer may optionally contain further components, such as buffer substances, complexing agents, antifoams, organic solvents in small amounts, corrosion inhibitors, dyes, surfactants and/or hydrotropic agents as well known in the art. The developer may further contain compounds which increase the developer resistance of the non-image areas, e.g. a polyalcohol such as sorbitol, preferably in a concentration of at least 40 g/l, and/or a poly(alkylene oxide) containing compound such as e.g. Supronic B25, commercially available from RODIA, preferably in a concentration of at most 0.15 g/l.

The development is preferably carried out at temperatures of from 20 to 40° C. in automated processing units as customary in the art. For regeneration, alkali metal silicate solutions having alkali metal contents of from 0.6 to 2.0 mol/l can suitably be used. These solutions may have the same silica/alkali metal oxide ratio as the developer (generally, however, it is lower) and likewise optionally contain further additives. The required amounts of regenerated material must be tailored to the developing apparatuses used, daily plate throughputs, image areas, etc. and are in general from 1 to 50 ml per square meter of plate precursor. The addition can be regulated, for example, by measuring the conductivity as described in EP-A 0 556 690. The processing of the plate precursor may also comprise a rinsing step, a drying step and/or a gumming step. The plate precursor can, if required, be post-treated with a suitable correcting agent or preservative as known in the art. To increase the resistance of the finished printing plate and hence to extend the run length, the layer can be briefly heated to elevated temperatures ("baking").

The printing plate thus obtained can be used for conventional, so-called wet offset printing, in which ink and an aqueous dampening liquid is supplied to the plate. Another suitable printing method uses so-called single-fluid ink without a dampening liquid. Suitable single-fluid inks have been described in U.S. Pat. No. 4,045,232; U.S. Pat. No.

4,981,517 and U.S. Pat. No. 6,140,392. In a most preferred embodiment, the single-fluid ink comprises an ink phase, also called the hydrophobic or oleophilic phase, and a polyol phase as described in WO 00/32705.

The oleophilic coating described herein can also be used as a thermo-resist for forming a pattern on a substrate by direct imaging techniques, e.g. in a PCB (printed circuit board) application as described in US 2003/0003406 A1.

EXAMPLES

Methods of Evaluation

A suitable method for determining the energy density value for the practical exposure of a positive-working thermal plate will be explained hereafter. A halftone image is exposed on the plate at is various energy density values and the actual dot area obtained on the plate, after processing according to the conditions (time, temperature, developer) used, is then measured by means of a reflection densitometer and compared with the target dot area that was set in the software (RIP) of the imagesetter. A typical example of such a method is shown in FIG. 1 wherein the dot area obtained on the plate, exposed with a 50% 200 lpi screen (about 80 lines/cm), is plotted versus the energy density of the exposure. The dot area values were obtained by means of a $^{CC}$Dot$^3$ densitometer, commercially available from Centurfax Ltd. FIG. 1 shows that at low energy densities, the dot area on the plate is larger than the target value of 50%: it is believed that, due to the underexposure, the coating just around the edge of the dot does not dissolve sufficiently rapidly in the developer. At too high energy density values, the overexposure of the coating around the dot leads to dissolution of the edges of the dot, resulting in a dot area value that is lower than 50%. These effects are especially significant when the laser spot has a pronounced gaussian intensity profile and less with a steep intensity profile. From a curve as shown in FIG. 1, it can be established by interpolation at which energy density the obtained dot area coincides with the target value (50%): that value is referred to herein as the 'right exposure energy density' (REED). In other words, the REED value is defined as the minimum energy density at which the dot area on the plate, occupied by a screened image corresponding to a 50% halftone in the image data, coincides with the 50% target value. It is clear to the skilled person that a lower REED value indicates a higher sensitivity of the plate.

Another parameter which can be used for quantifying the sensitivity is the clearing point (CP), which will now be explained. Exposure of a positive-working thermal plate at an energy density which is insufficient to raise the temperature of the coating up to the threshold value of the imaging mechanism has no significant effect on the dissolution kinetics of the exposed area. As a result, after processing according to the conditions (time, temperature, developer) used, the coating normally remains on the support, i.e. the optical density of the coating essentially equals $D_u$, the optical density of the unexposed plate. At higher energy densities, the temperature in the coating approaches and eventually exceeds the threshold temperature and, as a result, the density of the coating that remains on the plate after processing decreases. The minimum energy density that is required to produce a reduction of the optical density of the exposed and processed plate coating by a factor of 95%, i.e. to produce an optical density of $0.05*D_u$, is defined herein as the 'clearing point'.

Figure 2:
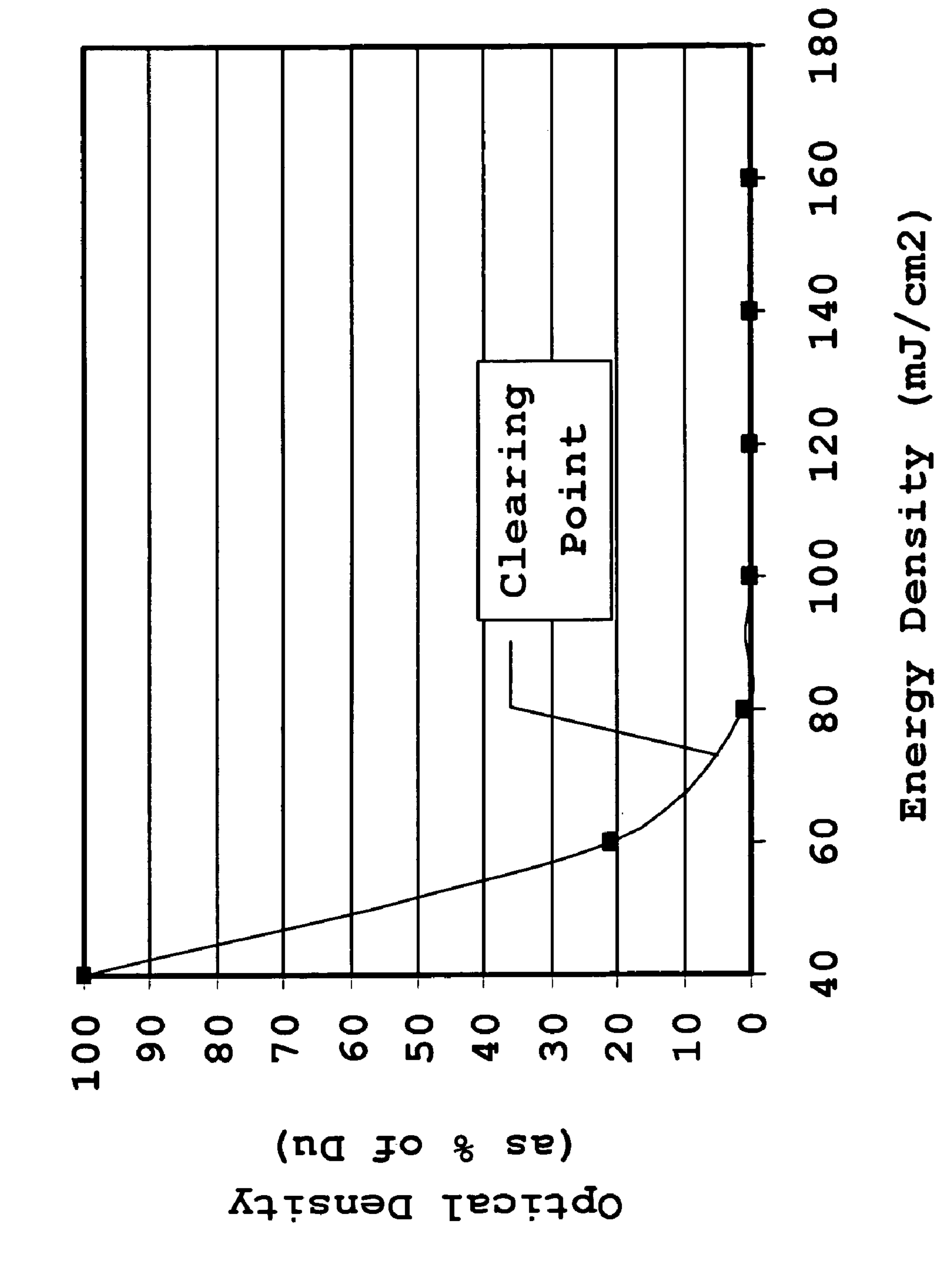
FIG. 2 represents the relationship between the optical density of the coating of Inventive Example 1 after processing and the energy density of the exposure.

CP can be measured by exposing a solid wedge on the plate, i.e. a series of areas consisting entirely of 0% dots (full exposure at all imagesetter pixels) which are exposed on the plate at various energy density values. The method is explained with reference to FIG. 2 wherein these energy density values form a series of discrete values resulting in a step-wedge, but it should be clear to the skilled reader that the energy density values may also vary continuously so as to obtain a continuous wedge. A preferred continuous wedge varies by not more than 10 mJ/cm$^2$ per cm wedge length. The minimum and maximum energy density for exposing the wedge should be adjusted to the particular type of plate that is being tested. The step-wedge used for the present Examples ranged from 30 to 300 mJ/cm$^2$ with intervals of 20 mJ/cm$^2$. The wedge was generated by the software that controls the imagesetter, although similar results can be obtained by other means, e.g. by placing a wedge filter in the light path of the imagesetter, preferably in contact with the plate. CP was determined by plotting the discrete values of optical density of the exposed and processed plate vs. the energy density as shown in FIG. 2 and establishing by interpolation at which energy density the optical density of the coating is reduced by 95%.

In practice it is observed that the CP value is smaller than the REED. The Under-Exposure Latitude (UEL) is defined herein as the difference between the REED and the CP values, expressed as a percentage of the REED: UEL=(REED−CP)*100/REED. A high UEL value is preferred because fluctuation of processing conditions, batch-to-batch speed variations of the plate precursor, etc., have no significant influence when UEL is high, i.e. when REED is large compared to CP. When UEL is low, shifts of the CP and REED values may result in an incomplete clean-out of the exposed areas, resulting in toning (ink-acceptance at the non-image areas).

Finally, a fourth parameter suitable for characterizing the plate precursor of the present invention is the Developer Resistance (DR). DR is a measure for the resistance of the non-exposed areas towards the developer and is defined as $(D_o-D_2)*100/D_o$ wherein $D_o$ is the optical density of the unexposed and undeveloped plate coating, and wherein $D_2$ is the optical density of the coating of the unexposed plate after being put through the processor twice. A smaller value of DR indicates a higher developer resistance.

Optical density values for measuring CP and DR were obtained by means of a GretagMacbeth D19C 47B/P densitometer, commercially available from Gretag-Macbeth AG. Such reflection densitometers are typically equipped with several filters (e.g. cyan, magenta, yellow): the optical density was measured with the filter that corresponds to the color of the coating, e.g. a cyan filter is preferably used for measuring the optical density of a blue colored coating. All optical density values were measured with reference to the uncoated support of the plate.

Invention Example 1

Preparation of Printing Plate Precursor

The printing plate precursors were produced by coating the solution defined in Table 1 onto an electrochemically roughened and anodically oxidised aluminum sheet (anodic weight of 3 g/m$^2$), the surface of which has been rendered hydrophilic by treatment with an aqueous solution of polyvinyl phosphonic acid, at a wet coating thickness of 26 μm and then dried.

TABLE 1

| composition of the coating solution | |
|---|---|
| INGREDIENTS | Parts (grams) |
| Tetrahydrofuran | 210.16 |
| 20 wt. % solution of POLYMER-01 (1) in Dowanol PM (2) | 158.03 |
| Dowanol PM (2) | 330.04 |
| Methyl ethyl ketone | 267.99 |
| S0094 (3) | 1.52 |
| 1 wt. % solution of TegoGlide 410 (4) in Dowanol PM | 21.72 |
| PDA-01 (solid) | 10.54 |

(1) POLYMER-01 is prepared by the following method: Preparation of the diazonium solution: A mixture of 2.6 g AM-10 and 25 ml acetic acid and 37.5 ml water was cooled to 15° C. Then 2.5 ml concentrated HCl was added and the mixture was further cooled to 0° C. Then, a solution of 1.1 g $NaNO_2$ in 3 ml water was added dropwise after which stirring was continued for another 30 minutes at 0° C. AM-10 is a compound having the following chemical structure:

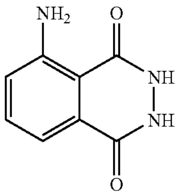

Preparation of the phenolic polymer solution: A mixture of 45.9 g ALNOVOL SPN452 (Alnovol SPN452 is a solution of a novolac resin, 40% by weight in Dowanol PM, obtained from Clariant GmbH), 16.3 g NaOAc•$3H_2O$ and 200 ml 1-methoxy-2-propanol was stirred and cooled to 10° C. The above prepared diazonium solution was added dropwise to the phenolic polymer solution over a 30 minute period after which stirring was continued for 120 minutes at 15° C. The resulting mixture was then added to 2 liters ice-water over a 30 minute period while continuously stirring. The polymer was precipitated from the aqueous medium and was isolated by filtration. The desired product was finally obtained by washing with water and subsequent drying at 45° C.

(2) Dowanol PM is 1-methoxy-2-propanol from Dow Chemical Company.

(3) S0094 is an IR absorbing cyanine dye commercially available from FEW Chemicals. S0094 has the chemical structure IR-1 shown above.

(4) TegoGlide 410 is a block-co-polysiloxane/poly(alkylene oxide) surfactant, commercially available from Tego Chemie Service GmbH.

Exposure and Development

The printing plate precursors were then exposed with a CREO TRENDSETTER 3244 T, a plate-setter available from CREO, Burnaby, Canada, at 2450 dpi with a 50% screen (200 lpi) and with a solid area (100%) at different energy densities ranging from 60 mJ/cm$^2$ up to 280 mJ/cm$^2$. After imaging, the plates were developed in an AUTOLITH T processor, operating at 25° C., in a developing solution composed of a mixture of 870 g demineralised water, 108 g sodium metasilicate.5aqua, 0.135 g Supronic B25, commercially available from RODIA, and 41.7 ml of a 70 wt. % aqueous solution of sorbitol.

The results are summarized in Table 6.

Invention Example 2

This example is carried out in the same way as Invention Example 1, with the exception that the printing plate precursor is produced by coating the solution defined in Table 2 on the support.

TABLE 2

| composition of the coating solution | |
|---|---|
| INGREDIENTS | Parts (grams) |
| Tetrahydrofuran | 210.16 |
| 20 wt. % solution of POLYMER-01 (1) in Dowanol PM (2) | 136.96 |
| Dowanol PM (2) | 346.90 |
| Methyl ethyl ketone | 267.99 |
| S0094 (3) | 1.52 |
| 1 wt. % solution of TegoGlide 410 (4) in Dowanol PM | 21.72 |
| PDA-06 (solid) | 14.75 |

(1), (2), (3) and (4) as defined in Table 1.

The results are summarized in Table 6.

Comparative Example 1

This example is carried out in the same way as Invention Example 1, with the exception that the printing plate precursor is produced by coating the solution defined in Table 3 on the support.

TABLE 3

| composition of the coating solution | |
|---|---|
| INGREDIENTS | Parts (grams) |
| Tetrahydrofuran | 210.16 |
| 20 wt. % solution of POLYMER-01 (1) in Dowanol PM (2) | 189.64 |
| Dowanol PM (2) | 304.76 |
| Methyl ethyl ketone | 267.99 |
| S0094 (3) | 1.52 |
| 1 wt. % solution of TegoGlide 410 (4) in Dowanol PM | 21.72 |

(1), (2), (3) and (4) as defined in Table 1.

The results are summarized in Table 6.

Comparative Example 2

This example is carried out in the same way as Invention Example 1, with the exception that the printing plate precursor is produced by coating the solution defined in Table 4 on the support.

TABLE 4

| composition of the coating solution | |
|---|---|
| INGREDIENTS | Parts (grams) |
| Tetrahydrofuran | 214.13 |
| 20 wt. % solution of POLYMER-01 (1) in Dowanol PM (2) | 210.23 |
| Dowanol PM (2) | 276.12 |
| Methyl ethyl ketone | 273.05 |
| S0094 (3) | 1.52 |
| 1 wt. % solution of TegoGlide 410 (4) in Dowanol PM | 21.72 |
| 3,4,5-trihydroxy benzophenon | 3.81 |

(1), (2), (3) and (4) as defined in Table 1.

The results are summarized in Table 6.

Comparative Example 3

This example is carried out in the same way as Invention Example 1, with the exception that the printing plate precursor is produced by coating the solution defined in Table 5 on the support.

TABLE 5

| composition of the coating solution | |
|---|---|
| INGREDIENTS | Parts (grams) |
| Tetrahydrofuran | 214.13 |
| 20 wt. % solution of POLYMER-01 (1) in Dowanol PM (2) | 210.23 |
| Dowanol PM (2) | 276.12 |
| Methyl ethyl ketone | 273.05 |
| S0094 (3) | 1.52 |
| 1 wt. % solution of TegoGlide 410 (4) in Dowanol PM | 21.72 |
| 3,4,5-trimethoxy cinnamic acid | 2.82 |

(1), (2), (3) and (4) as defined in Table 1.

The results are summarized in Table 6.

Results

TABLE 6

| results of REED, CP, UEL and DR | | | | | |
|---|---|---|---|---|---|
| | Invention Example 1 | Invention Example 2 | Comparat. Example 1 | Comparat. Example 2 | Comparat. Example 3 |
| REED ($mJ/m^2$) | 167 | 158 | >280 | 176 | 187 |
| CP ($mJ/m^2$) | 73 | 77 | 200 | 105 | 100 |
| UEL (%) | 56 | 51 | 29 | 40 | 47 |
| DR (%) | 2 | 2 | 0 | 8 | 19 |

The Invention Examples 1 and 2 demonstrate that a positive-working printing plate precursor which comprises a PDA, exhibits a higher sensitivity, i.e. a lower value for REED and CP, in comparison with the Comparative Example 1, having no PDA, or with the Comparative Examples 2 and 3, having a low molecular weight developer accelerator.

Also, the UEL exhibits an increased value for the Invention Examples 1 and 2 in comparison with the Comparative Examples 1 to 3. The resistance against the developer (DR) is much higher for the Invention Examples 1 and 2 in comparison with the Comparative Examples 2 and 3: due to the presence of low molecular weight development accelerators, the values for DR are increased to 8% resp. 19%.

Due to the absence of a developer accelerator (low or high molecular weight), the Comparative Example 1 shows no difference in optical density, and this high DR is substantially not affected by adding the PDA of the Invention Examples 1 and 2, showing a difference in optical density of only 2%.

Invention Example 3

This example is carried out in the same way as Invention Example 1, with the exception that the printing plate precursor is produced by coating the solution defined in Table 7 on the support.

TABLE 7

| composition of the coating solution | |
|---|---|
| INGREDIENTS | Parts (grams) |
| Tetrahydrofuran | 208.78 |
| POLYMER-01 (1) (solid) | 29.30 |
| Dowanol PM (2) | 400.05 |
| Methyl ethyl ketone | 266.22 |
| S0094 (3) | 2.16 |

TABLE 7-continued

| composition of the coating solution | |
|---|---|
| INGREDIENTS | Parts (grams) |
| 1 wt. % solution of Basonyl Blue 640 (5) in Dowanol PM | 53.93 |
| 1 wt. % solution of TegoGlide 410 (4) in Dowanol PM | 21.58 |
| PDA-01 (solid) | 12.56 |

(1), (2), (3) and (4) as defined in Table 1.
(5) Basonyl Blue 640 is a quaternized triarylmethane dye commercially available from BASF.

The results are summarized in Table 8.

Comparative Example 4

This example is carried out in the same way as Invention Example 3, with the exception that, in the preparation of the coating solution, 12.56 g of POLYMER-02 (POLYMER-02 is an ortho-cresol novolac resin obtained from SCHNECTADY INTERATIONAL INC.) is used instead of 12.56 g of PDA-01.

The results are summarized in Table 8.

Comparative Example 5

This example is carried out in the same way as Invention Example 3, with the exception that, in the preparation of the coating solution, 12.56 g of POLYMER-03 (POLYMER-03 is a para-cresol novolac resin obtained from BORDON CHEM. INC.) is used instead of 12.56 g of PDA-01.

The results are summarized in Table 8.

Results:

TABLE 8

| results of REED, CP, UEL and DR | | | |
|---|---|---|---|
| | Invention Example 3 | Comparative Example 4 | Comparative Example 5 |
| REED ($mJ/m^2$) | 131 | 171 | 205 |
| CP ($mJ/m^2$) | 58 | 87 | 110 |
| UEL (%) | 56 | 49 | 46 |
| DR (%) | 1 | 2 | 2 |

The Invention Example 3 demonstrates that a positive-working printing plate precursor which comprises a PDA exhibits a higher sensitivity, i.e. a lower value for REED and CP, in comparison with the Comparative Examples 4 and 5, which comprise an ortho-cresol novolac or a para-cresol novolac.

Also, the UEL exhibits an increased value for the Invention Example 3 in comparison with the Comparative Examples 3 and 4.

Invention Example 3 shows a difference in optical density of 1%, and, due to the absence of a low molecular weight developer accelerator, this high DR is substantially the same than the DR of the Comparative Examples 4 and 5, showing a difference in optical density of 2%.

Invention Example 4

This example is carried out in the same way as Invention Example 1, with the exception that the printing plate precursor is produced by coating the solution defined in Table 9 on the support.

After coating and drying the printing plate precursor was stored for 3 days at 50° C.

In the developing step of the plates the developing solution of Invention Example 1 is replaced by the developing solution TD6000, commercially available from AGFA.

TABLE 9 composition of the coating solution

| INGREDIENTS | Parts (grams) |
|---|---|
| Tetrahydrofuran | 207.80 |
| 20 wt. % solution of POLYMER-01 (1) in Dowanol PM (2) | 205.84 |
| Dowanol PM (2) | 286.00 |
| Methyl ethyl ketone | 263.80 |
| S0094 (3) | 1.302 |
| 1 wt. % solution of TegoGlide 410 (4) in Dowanol PM | 21.55 |
| PDA-09 (solid) | 13.71 |

(1), (2), (3) and (4) as defined in Table 1.

The results are summarized in Table 10.

TABLE 10 results of REED, CP, UEL and DR

| | Invention Example 4 |
|---|---|
| REED ($mJ/m^2$) | 113 |
| CP ($mJ/m^2$) | 60 |
| UEL (%) | 47 |
| DR (%) | 7 |

Invention Example 4 demonstrates that, after aging for 3 days at 50° C., a positive-working printing plate precursor which comprises a PDA exhibits a high sensitivity, i.e. a low value for REED and CP, a high UEL-value and a low DR-value.

Invention Example 5

This example is carried out in the same way as Invention Example 1, with the exception that the printing plate precursor is produced by coating the solution defined in Table 11 on the support at a wet coating thickness of 20 μm and then dried for one minute at 130° C. In the developing step of the plates the developing solution of Invention Example 1 is replaced by the developing solution TD6000, commercially available from AGFA.

TABLE 11 composition of the coating solution

| INGREDIENTS | Parts (grams) |
|---|---|
| ALNOVOL SPN452 (1) | 5.76 |
| Dowanol PM (2) | 14.36 |
| Methyl ethyl ketone | 23.38 |
| S0094 (3) | 0.137 |
| 1 wt. % solution of Basonyl Blue 640 (5) in Dowanol PM | 3.45 |
| 1 wt. % solution of TegoGlide 410 (4) in Dowanol PM | 1.37 |
| 1 wt. % solution of TegoWet 265 (6) in Dowanol PM | 0.56 |
| PDA-09 (solid) | 0.73 |

(1) ALNOVOL SPN452 is a is a solution of a novolac resin, 40% by weight in Dowanol PM (2), obtained from CLARIANT GmbH.
(2), (3) and (4) as defined in Table 1.
(5) Basonyl Blue 640 is a quaternized triarylmethane dye, commercially available from BASF.
(6) TEGOWET 265 is a polysiloxane copolymer, commercially available from Tego Chemie Service GmbH.

The results are summarized in Table 12.

Comparative Example 6

This example is carried out in the same way as Invention Example 5, with the exception that, in the preparation of the coating solution, 6.71 g of ALNOVOL SPN452 is used instead of 5.76 g and 0.73 g of PDA-09 is replaced by 0.35 g of 3,4,5-trimethoxy cinnamic acid. The results are summarized in Table 12.

Comparative Example 7

This example is carried out in the same way as Invention Example 5, with the exception that, in the preparation of the coating solution, 6.58 g of ALNOVOL SPN452 is used instead of 5.76 g and 0.73 g of PDA-09 is replaced by 0.40 g of 3,4,5-trimethoxy cinnamic acid.

The results are summarized in Table 12.

TABLE 12 results of the measurements

| | Invention Example 5 | Comparative Example 6 | Comparative Example 7 |
|---|---|---|---|
| REED ($mJ/m^2$) | 124 | 122 | 113 |
| CP ($mJ/m^2$) | <60 | 83 | <60 |
| UEL (%) | >64 | 39 | >53 |
| DR (%) | 0 | 1 | 9 |

The Invention Example 5 demonstrates that a positive-working printing plate precursor which comprises a PDA, exhibits for about the same REED an improved CP and an improved UEL in comparison with the Comparative Example 6 which comprises a low molecular weight developer accelerator instead of a PDA.

Due to an increased amount of the low molecular weight developer accelerator, the Comparative Example 7 exhibits, in comparison with the Invention Example 5, about the same REED and CP, but the high DR-value indicates a reduced resistance against the developer.

The invention claimed is:

1. A positive-working heat-sensitive lithographic printing plate precursor comprising a support having a hydrophilic surface or which is provided with a hydrophilic layer and an oleophilic coating provided on the support, said coating comprising an infrared light-to-heat converter and an alkali-soluble phenolic resin, wherein the phenyl group of the phenolic monomeric unit of said phenolic resin is (a) chemically modified with an organic substituent comprising a group having the chemical structure of Formula I:

(formula I)

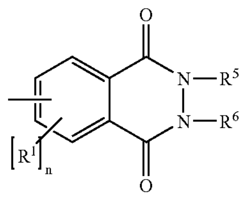

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, —SO$_2$—NH—R$^2$, —NH—SO$_2$—R$^4$, —CO—NR$^2$—R$^3$, —NR$^2$—CO—R$^4$, —O—CO—R$^4$, —CO—O—R$^2$, —CO—R$^2$, —SO$_3$—R$^2$, —SO$_2$—R$^2$, —SO—R$^4$, —P(═O)(—O—R$^2$)—(—O—R$^3$), —NR$^2$—R$^3$, —O—R$^2$, —S—R$^2$, —CN, —NO$_2$, a halogen, —N-phthalimidyl, —M—N-phthalimidyl, or —M—R$^2$, wherein M represents a divalent linking group containing 1 to 8 carbon atoms, wherein R$^2$, R$^3$, R$^5$ and R$^6$ are independently selected from hydrogen or an optionally substituted alkyl, alkenyl, alkynyl, cycloalkyl, heterocyclic, aryl, heteroaryl, aralkyl or heteroaralkyl group, wherein R$^4$ is selected from an optionally substituted alkyl, alkenyl, alkynyl, cycloalkyl, heterocyclic, aryl, heteroaryl, aralkyl or heteroaralkyl group, or wherein at least two groups selected from each R$^1$ to R$^4$ together represent the necessary atoms to form a cyclic structure, or wherein R$^5$ and R$^6$ together represent the necessary atoms to form a cyclic structure, or (b) substituted with a group having the structure —N═N—O, wherein the —N═N— group is covalently bound to a carbon atom of the phenyl group and wherein O is an aromatic group, wherein said coating further comprises a polymeric development accelerator, and wherein said polymeric development accelerator is a phenolic formaldehyde resin comprising at least 70 mol % of meta-cresol as a recurring monomeric unit.

2. A positive-working heat-sensitive lithographic printing plate precursor comprising a support having a hydrophilic surface or which is provided with a hydrophiic layer and an oleophilic coating provided on the support, said coating comprising an infrared light-to-heat converter and an alkali-soluble phenolic resin, wherein the phenyl group of the phenolic monomeric unit of said phenolic resin is (a) chemically modified with an organic substituent comprising a group having the chemical structure of Formula I:

(formula I)

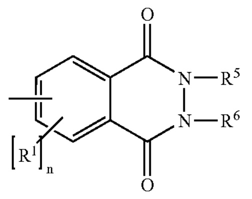

wherein n is 0, 1, 2 or 3, wherein each R$^1$ is selected from hydrogen, an optionally substituted alkyl, alkenyl, alkynyl, cycloalkyl, heterocyclic, aryl, heteroaryl, aralkyl or heteroaralkyl group, —SO$_2$—NH—R$^2$, —NH—SO$_2$—R$^4$, —CO—NR$^2$—R$^3$, —NR$^2$—CO—R$^4$, —O—CO—R$^4$, —CO—O—R$^2$, —CO—R$^2$, —SO$_3$—R$^2$, —SO$_2$—R$^2$, —SO—R$^4$, —P(═O)(—O—R$^2$)(—O—R$^3$), —NR$^2$—R$^3$, —O—R$^2$, —S—R$^2$, —CN, —NO$_2$, a halogen, —N-phthalimidyl, —M—N-phthalimidyl, or —M—R$^2$, wherein M represents a divalent linking group containing 1 to 8 carbon atoms, wherein R$^2$, R$^3$, R$^5$ and R$^6$ are independently selected from hydrogen or an optionally substituted alkyl, alkenyl, alkynyl, cycloalkyl, heterocyclic, aryl, heteroaryl, aralkyl or heteroaralkyl group, wherein R$^4$ is selected from an optionally substituted alkyl, alkenyl, alkynyl, cycloalkyl, heterocyclic, aryl, heteroaryl, aralkyl or heteroaralkyl group, or wherein at least two groups selected from each R$^1$ to R$^4$ together represent the necessary atoms to form a cyclic structure, or wherein R$^5$ and R$^6$ together represent the necessary atoms to form a cyclic structure, or (b) substituted with a group having the structure —N═N—O, wherein the —N═N— group is covalently bound to a carbon atom of the phenyl group and wherein O is an aromatic group, wherein said coating further comprises a polymeric development accelerator, and wherein said polymeric development accelerator is a phenolic formaldehyde resin comprising at least 40 mol % of monohydroxy benzene as a recurring monomeric unit.

3. A positive-working heat-sensitive lithographic printing plate precursor comprising a support having a hydrophilic surface or which is provided with a hydrophilic layer and an oleophilic coating provided on the support, said coating comprising an infrared light-to-heat converter and an alkali-soluble phenolic resin, wherein the phenyl group of the phenolic monomeric unit of said phenolic resin is (a) chemically modified with an organic substituent comprising a group having the chemical structure of Formula I:

(formula I)

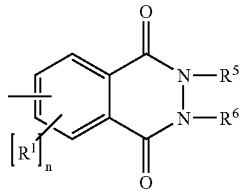

wherein n is 0, 1, 2 , or 3, wherein each R$^1$ is selected from hydrogen, an optionally substituted alkyl, alkenyl, alkynyl, cycloalkyl, heterocyclic, aryl, heteroaryl, aralkyl or heteroaralkyl group, —SO$_2$—NH—R$^2$, —NH—SO$_2$—R$^4$, —CO—NR$^2$—R$^3$, —NR$^2$—CO—R$^4$, —O—CO—R$^4$, —CO—O—R$^2$, —CO—R$^2$, —SO$_3$—R$^2$, —SO$_2$—R$^2$, —SO—R$^4$, —P(═O)(—O—R$^2$)(—O—R$^3$), —NR$^2$—R$^3$, —O—R$^2$, —S—R$^2$, —CN, —NO$_2$, a halogen, —N-phthalimidyl, —M—N-phthalimidyl, or —M—R$^2$, wherein M represents a divalent linking group containing 1 to 8 carbon atoms, wherein R$^2$, R$^3$, R$^5$ and R$^6$ are independently selected from hydrogen or an optionally substituted alkyl, alkenyl, alkynyl, cycloalkyl, heterocyclic, aryl, heteroaryl, aralkyl or heteroaralkyl group, wherein R$^4$ is selected from an optionally substituted alkyl, alkenyl, alkynyl, cycloalkyl, heterocyclic, aryl, heteroaryl, aralkyl or heteroaralkyl group, or wherein at least two groups selected from each R$^1$ to R$^4$ together represent the necessary atoms to form a cyclic structure, or wherein R$^5$ and R$^6$ together represent the necessary atoms to form a cyclic structure, or (b) substituted with a group having the structure —N═N—O, wherein the —N═N— group is covalently bound to a carbon atom of the phenyl group and wherein O is an aromatic group, wherein said coating further comprises a polymeric development accelerator, and wherein said polymeric development accelerator is a phenolic formaldehyde resin comprising at least 5 mol % of a recurring monomeric unit having at least one phenolic hydroxy group and at least one alkali solubilizing group.

4. A positive-working heat-sensitive lithographic printing plate precursor according to claim 3, wherein said alkali solubilizing group is selected from the list consisting of a hydroxyl group, a carboxylic acid group, a sulphonic acid group, a sulphuric acid group, a phosphoric acid group, a phosphonic acid group and a thiol group.

5. A positive-working heat-sensitive lithographic printing plate precursor according to claim 3, wherein said recurring monomeric unit has 2 or more phenolic hydroxyl groups.

6. A positive-working heat-sensitive lithographic printing plate precursor according to claim 5, wherein said recurring monomeric unit is resorcinol, pyrocatechol, hydroquinone, hydroxy hydroquinone, pyrogallol, phloroglucinol or dihydroxy benzoic acid.

7. A lithographic printing plate precursor according to claim 1 wherein said coating further comprises a dissolution inhibitor.

8. A lithographic printing plate precursor according to claim 7 wherein said dissolution inhibitor is a water-repellent polymer.

9. A lithographic printing plate precursor according to claim 7 wherein said dissolution inhibitor is a polymer comprising siloxane and/or perfluoroalkyl units; or a block- or graft-copolymer of a poly(alkylene oxide) block and a block comprising siloxane and/or perfluoroalkyl units.

10. A lithographic printing plate precursor according to claim 7 wherein said dissolution inhibitor is an organic compound comprising an aromatic group and at least one hydrogen bonding site.

11. A method of making a heat-sensitive lithographic printing plate precursor according to claim 1 comprising the steps of providing a support having a hydrophilic surface or which is provided with a hydrophilic layer; and applying on said hydrophilic surface of said support an oleophilic coating, wherein said coating comprises an infrared light-to-heat converter, an alkali-soluble phenolic resin, wherein the phenyl group of the phenolic monomeric unit of said phenolic resin is (a) chemically modified with an organic substituent comprising a group having the chemical structure of Formula I:

(formula I)

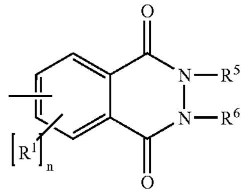

wherein n is 0, 1, 2 , or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(═O)—(—O—R^2)(—O—R^3)$, $—NR^2—R^3$, $—O—R^2$, $—S—R^2$, —CN, $—NO_2$, a halogen, —N-phthalimidyl, —M—N-phthalimidyl, or $—M—R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure, or (b) substituted with a group having the structure —N═N—O, wherein the —N═N— group is covalently bound to a carbon atom of the phenyl group and wherein O is an aromatic group, wherein said coating further comprises a polymeric development accelerator, and wherein said polymeric development accelerator is a phenolic formaldehyde resin comprising at least 70 mol % of meta-cresol as a recurring monomeric unit.

12. A method of making a positive-working lithographic printing plate comprising the steps of providing a heat-sensitive lithographic printing plate precursor according to claim 1, image-wise exposing the coating to infrared light or heat, and developing the image-wise exposed coating with an aqueous alkaline developer, wherein exposed areas of said coating dissolve in said aqueous alkaline developer.

13. A positive-working heat-sensitive lithographic printing plate precursor according to claim 1, wherein O has the structure of formula I:

(formula I)

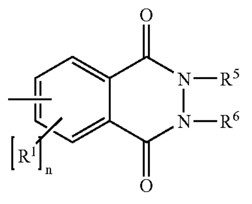

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(═O)(—O—R^2)(—O—R^3)$, $—NR^2—R^3$, $—O—R^2$, $—S—R^2$, —CN, $—NO_2$, a halogen, —N-phthalimidyl, —M—N-phthalimidyl, or —M—$R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

14. A positive-working heat-sensitive lithographic printing plate precursor according to claim 2 wherein O has the structure of formula I:

(formula I)

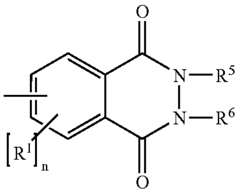

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^2$, —NH—$SO_2$—$R^4$, —CO—$NR^2$—$R^3$, —$NR^2$—CO—$R^4$, —O—CO—$R^4$, —CO—O—$R^2$, —CO—$R^2$, —$SO_3$—$R^2$, —$SO_2$—$R^2$, —SO—$R^4$, —P(=O)(—O—$R^2$)(—O—$R^3$), —$NR^2$—$R^3$, —O—$R^2$, —S—$R^2$, —CN, —$NO_2$, a halogen, —N-phthalimidyl, —M—N-phthalimidyl, or —M—$R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

15. A positive-working heat-sensitive lithographic printing plate precursor according to claim 3 wherein O has the structure of formula I:

(formula I)

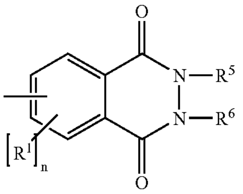

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^2$, —NH—$SO_2$—$R^4$, —CO—$NR^2$—$R^3$, —$NR^2$—CO—$R^4$, —O—CO—$R^4$, —CO—O—$R^2$, —CO—$R^2$, —$SO_3$—$R^2$, —$SO_2$—$R^2$, —SO—$R^4$, —P(=O)(—O—$R^2$)(—O—$R^3$), —$NR^2$—$R^3$, —O—$R^2$, —S—$R^2$, —CN, —$NO_2$, a halogen, —N-phthalimidyl, —M—N-phthalimidyl, or —M—$R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

16. A positive-working heat-sensitive lithographic printing plate precursor according to claim 4 wherein O has the structure of formula I:

(formula I)

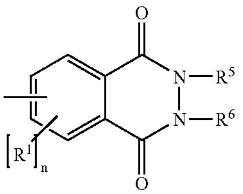

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^2$, —NH—$SO_2$—$R^4$, —CO—$NR^2$—$R^3$, —$NR^2$—CO—$R^4$, —O—CO—$R^4$, —CO—O—$R^2$, —CO—$R^2$, —$SO_3$—$R^2$, —$SO_2$—$R^2$, —SO—$R^4$, —P(=O)(—O—$R^2$)(—O—$R^3$), —$NR^2$—$R^3$, —O—$R^2$, —S—$R^2$, —CN, —$NO_2$, a halogen, —N-phthalimidyl, —M—N-phthalimidyl, or —M—$R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

17. A positive-working heat-sensitive lithographic printing plate precursor according to claim 5 wherein O has the structure of formula I:

(formula I)

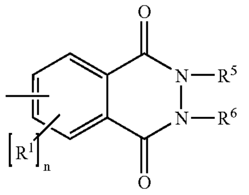

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(=O)(—O—R^2)(—O—R^3)$, $—NR^2—R^3$, $—O—R^2$, $—S—R^2$, —CN, $—NO_2$, a halogen, —N-phthalimidyl, —M—N-phthalimidyl, or $—M—R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

18. A positive-working heat-sensitive lithographic printing plate precursor according to claim 6 wherein O has the structure of formula I:

(formula I)

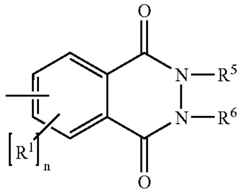

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(=O)(—O—R^2)(—O—R^3)$, $—NR^2—R^3$, $—O—R^2$, $—S—R^2$, —CN, $—NO_2$, a halogen, —N-phthalimidyl, —M—N-phthalimidyl, or $—M—R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

19. A method of making a heat-sensitive lithographic printing plate precursor according to claim 11 wherein O has the structure of formula I:

(formula I)

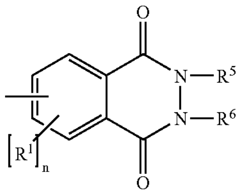

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(=O)(—O—R^2)(—O—R^3)$, $—NR^2—R^3$, $—O—R^2$, $—S—R^2$, —CN, $—NO_2$, a halogen, —N-phthalimidyl, —M—N-phthalimidyl, or $—M—R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

20. The positive-working heat-sensitive lithographic printing plate precursor according to claim 1, wherein the phenyl group of the phenolic monomeric unit of said phenolic resin is chemically modified with an organic substituent comprising a group having the chemical structure of Formula I.

21. The positive-working heat-sensitive lithographic printing plate precursor according to claim 2, wherein the phenyl group of the phenolic monomeric unit of said phenolic resin is chemically modified with an organic substituent comprising a group having the chemical structure of Formula I.

22. The positive-working heat-sensitive lithographic printing plate precursor according to claim 3, wherein the phenyl group of the phenolic monomeric unit of said phenolic resin is chemically modified with an organic substituent comprising a group having the chemical structure of Formula I.

23. The method of making a heat-sensitive lithographic printing plate precursor according to claim 11, wherein the phenyl group of the phenolic monomeric unit of said phenolic resin is chemically modified with an organic substituent comprising a group having the chemical structure of Formula I.

24. The positive-working heat-sensitive lithographic printing plate precursor according to claim 1, wherein the phenyl group of the phenolic monomeric unit of said phenolic resin is substituted with a group having the structure —N═N—O, wherein the —N═N— group is covalently bound to a carbon atom of the phenyl group, and wherein O is an aromatic group.

25. The positive-working heat-sensitive lithographic printing plate precursor according to claim 2, wherein the phenyl group of the phenolic monomeric unit of said phenolic resin is substituted with a group having the structure —N═N—O, wherein the —N═N— group is covalently bound to a carbon atom of the phenyl group, and wherein O is an aromatic group.

26. The positive-working heat-sensitive lithographic printing plate precursor according to claim 3, wherein the phenyl group of the phenolic monomeric unit of said phenolic resin is substituted with a group having the structure —N═N—O, wherein the —N═N— group is covalently bound to a carbon atom of the phenyl group, and wherein O is an aromatic group.

27. The method of making a heat-sensitive lithographic printing plate precursor according to claim 11, wherein the phenyl group of the phenolic monomeric unit of said phenolic resin is substituted with a group having the structure —N═N—O, wherein the —N═N— group is covalently bound to a carbon atom of the phenyl group, and wherein O is an aromatic group.

28. The positive-working heat-sensitive lithographic printing plate precursor according to claim 13, wherein the phenyl group of the phenolic monomeric unit of said phenolic resin is substituted with a group having the structure —N═N—O, wherein the —N═N— group is covalently bound to a carbon atom of the phenyl group, and wherein O is an aromatic group.

29. The positive-working heat-sensitive lithographic printing plate precursor according to claim 14, wherein the phenyl group of the phenolic monomeric unit of said phenolic resin is substituted with a group having the structure —N═N—O, wherein the —N═N— group is covalently bound to a carbon atom of the phenyl group, and wherein O is an aromatic group.

30. The positive-working heat-sensitive lithographic printing plate precursor according to claim 15, wherein the phenyl group of the phenolic monomeric unit of said phenolic resin is substituted with a group having the structure —N═N—O, wherein the —N═N— group is covalently bound to a carbon atom of the phenyl group, and wherein O is an aromatic group.

31. The method of making a heat-sensitive lithographic printing plate precursor according to claim 16, wherein the phenyl group of the phenolic monomeric unit of said phenolic resin is substituted with a group having the structure —N═N—O, wherein the —N═N— group is covalently bound to a carbon atom of the phenyl group, and wherein O is an aromatic group.

32. The positive-working heat-sensitive lithographic printing plate precursor according to claim 17, wherein the phenyl group of the phenolic monomeric unit of said phenolic resin is substituted with a group having the structure —N═N—O, wherein the —N═N— group is covalently bound to a carbon atom of the phenyl group, and wherein O is an aromatic group.

33. The positive-working heat-sensitive lithographic printing plate precursor according to claim 18, wherein the phenyl group of the phenolic monomeric unit of said phenolic resin is substituted with a group having the structure —N═N—O, wherein the —N═N— group is covalently bound to a carbon atom of the phenyl group, and wherein O is an aromatic group.

34. The positive-working heat-sensitive lithographic printing plate precursor according to claim 19, wherein the phenyl group of the phenolic monomeric unit of said phenolic resin is substituted with a group having the structure —N═N—O, wherein the —N═N— group is covalently bound to a carbon atom of the phenyl group, and wherein O is an aromatic group.

* * * * *